(12) United States Patent
Liu et al.

(10) Patent No.: US 11,502,099 B2
(45) Date of Patent: *Nov. 15, 2022

(54) THREE-DIMENSIONAL MEMORY DEVICES WITH ARCHITECTURE OF INCREASED NUMBER OF BIT LINES

(71) Applicant: YANGTZE MEMORY TECHNOLOGIES CO., LTD., Wuhan (CN)

(72) Inventors: Jun Liu, Wuhan (CN); Lei Xue, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 42 days.

This patent is subject to a terminal disclaimer.

(21) Appl. No.: 16/953,360

(22) Filed: Nov. 20, 2020

(65) Prior Publication Data

US 2021/0091110 A1  Mar. 25, 2021

Related U.S. Application Data

(63) Continuation of application No. 16/402,950, filed on May 3, 2019, now Pat. No. 10,879,263, which is a
(Continued)

(51) Int. Cl.
*H01L 27/11582* (2017.01)
*H01L 21/28* (2006.01)
(Continued)

(52) U.S. Cl.
CPC .... *H01L 27/11582* (2013.01); *H01L 27/1157* (2013.01); *H01L 27/11565* (2013.01);
(Continued)

(58) Field of Classification Search
CPC ......... H01L 27/11582; H01L 29/40117; H01L 21/76897; H01L 21/0228; H01L 23/53295;
(Continued)

(56) References Cited

U.S. PATENT DOCUMENTS 8,163,617 B2* 4/2012 Ahn ................. H01L 27/11556
438/259
9,219,074 B2* 12/2015 Chen ................. H01L 27/11582
(Continued)

FOREIGN PATENT DOCUMENTS

CN 103928467 A 7/2014
CN 106033791 A 10/2016
(Continued)

OTHER PUBLICATIONS

International Search Report issued in corresponding International Application No. PCT/CN2019/076717, dated Dec. 17, 2019, 4 pages.
(Continued)

*Primary Examiner* — Vu A Vu
(74) *Attorney, Agent, or Firm* — Bayes PLLC

(57) ABSTRACT

Embodiments of a three-dimensional (3D) memory device and fabrication method thereof are disclosed. The 3D memory device has an architecture with an increased number of bit lines. In an example, a stack structure is formed above a substrate. A plurality of memory strings each extending vertically through a memory region of the stack structure are formed. A plurality of bit lines are formed over the plurality of memory strings, such that at least one of the plurality of bit lines is electrically connected to a single one of the plurality of memory strings.

12 Claims, 9 Drawing Sheets

Related U.S. Application Data continuation of application No. PCT/CN2019/076717, filed on Mar. 1, 2019.

(51) Int. Cl.
  *H01L 27/11565* (2017.01)
  *H01L 27/1157* (2017.01)
  *H01L 27/11573* (2017.01)
  *G11C 7/18* (2006.01)

(52) U.S. Cl.
  CPC .. *H01L 27/11573* (2013.01); *H01L 29/40117* (2019.08); *G11C 7/18* (2013.01)

(58) Field of Classification Search
  CPC ......... H01L 21/76802; H01L 21/31111; H01L 27/1157
  USPC ...................................................... 257/324
  See application file for complete search history.

(56) References Cited

U.S. PATENT DOCUMENTS

| | | | |
|---|---|---|---|
| 9,449,983 | B2 | 9/2016 | Yada et al. |
| 9,698,153 | B2 | 7/2017 | Liu et al. |
| 10,879,263 | B2 * | 12/2020 | Liu .................. H01L 29/40117 |
| 2012/0064683 | A1 | 3/2012 | Ishiduki et al. |
| 2013/0100738 | A1 | 4/2013 | Choi |
| 2013/0336061 | A1 | 12/2013 | Kim et al. |
| 2015/0206898 | A1 | 7/2015 | Chen |
| 2015/0262689 | A1 * | 9/2015 | Hashimoto ........ G11C 16/3427 365/185.11 |
| 2016/0293621 | A1 | 10/2016 | Huang et al. |
| 2017/0077025 | A1 | 3/2017 | Akutsu |
| 2018/0069017 | A1 | 3/2018 | Barbato |
| 2019/0363100 | A1 * | 11/2019 | Lee ....................... H01L 23/528 |

FOREIGN PATENT DOCUMENTS

| | | |
|---|---|---|
| CN | 106169476 A | 11/2016 |
| CN | 107658317 A | 2/2018 |
| CN | 108040501 A | 5/2018 |
| CN | 109037227 A | 12/2018 |
| CN | 109314115 A | 2/2019 |
| CN | 109346473 A | 2/2019 |
| TW | 201535683 A | 9/2015 |
| TW | 201813057 A | 4/2018 |
| TW | 201834207 A | 9/2018 |
| TW | 201843818 A | 12/2018 |

OTHER PUBLICATIONS

Written Opinion of the International Searching Authority issued in corresponding International Application No. PCT/CN2019/076717, dated Dec. 17, 2019,, 4 pages.

Extended European Search Report issued in corresponding European Application No. 19 91 8166, dated Jun. 29, 2022, 8 pages.

* cited by examiner

THREE-DIMENSIONAL MEMORY DEVICES WITH ARCHITECTURE OF INCREASED NUMBER OF BIT LINES

CROSS REFERENCE TO RELATED APPLICATIONS

This application is a continuation of U.S. Application Ser. No. 16/402,950, filed on May 3, 2019, entitled "THREE-DIMENSIONAL MEMORY DEVICES WITH ARCHITECTURE OF INCREASED NUMBER OF BIT LINES," which is continuation of International Application No. PCT/CN2019/076717, filed on Mar. 1, 2019, entitled "THREE-DIMENSIONAL MEMORY DEVICES WITH ARCHITECTURE OF INCREASED NUMBER OF BIT LINES," both of which are incorporated therein by reference in their entireties.

BACKGROUND

Embodiments of the present disclosure relate to a memory device and fabrication methods thereof.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A three-dimensional (3D) device architecture can address the density limitation in some planar semiconductor devices, for example, flash memory devices.

SUMMARY

Embodiments of 3D memory devices and fabrication methods thereof are disclosed herein.

In one example, the 3D memory device includes a substrate, a plurality of memory strings each extending vertically above the substrate in a memory region, and a plurality of bit lines over the plurality of memory strings. At least one of the plurality of bit lines is electrically connected to a single one of the plurality of memory strings.

In another example, the 3D memory device includes a substrate, and a plurality of memory strings extending along a first lateral direction and a second lateral direction in a plan view. Each of the plurality of memory strings extends vertically above the substrate in a memory region. The 3D memory device also includes a plurality of bit lines extending along the second lateral direction over the plurality of memory strings. The plurality of bit lines are nominally parallel to one another. The 3D memory device also includes a cut structure overlapping with at least one of the plurality of memory strings in the plan view and dividing the plurality of memory strings into a first portion and a second portion along the second lateral direction. A number of bit lines above at least one of the plurality of memory strings is at least three.

In still another example, the 3D memory system includes a memory stack, a plurality of memory strings, a plurality of bit lines, and a plurality of peripheral devices. The memory stack includes a plurality of interleaved conductor layers and insulating layers in an insulating structure over a substrate. The plurality of memory strings extend in the memory stack along a first lateral direction and a second lateral direction of a memory region in a plan view, each of the plurality of memory strings extending vertically into the substrate. The plurality of bit lines are over and electrically connected to the plurality of memory strings. In some embodiments, at least one of the plurality of bit lines is electrically connected to a single one of the plurality of memory strings. A plurality of peripheral devices are electrically connected to the plurality of memory strings.

In yet another example, the 3D memory system includes a memory stack, a plurality of memory strings, a cut structure, a plurality of bit lines, and a plurality of peripheral devices. The memory stack includes a plurality of interleaved conductor layers and insulating layers in an insulating structure over a substrate. The plurality of memory strings extend in the memory stack along a first lateral direction and a second lateral direction in a plan view, each of the plurality of memory strings extending vertically into the substrate. The cut structure overlaps with at least one of the plurality of memory strings in the plan view and dividing the plurality of memory strings into a first portion and a second portion along the second lateral direction. The plurality of bit lines are over and electrically connected to the plurality of memory strings. The plurality of bit lines are each parallel to one another. A number of bit lines above at least one of the plurality of memory strings is at least three. A plurality of peripheral devices are electrically connected to the plurality of memory strings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
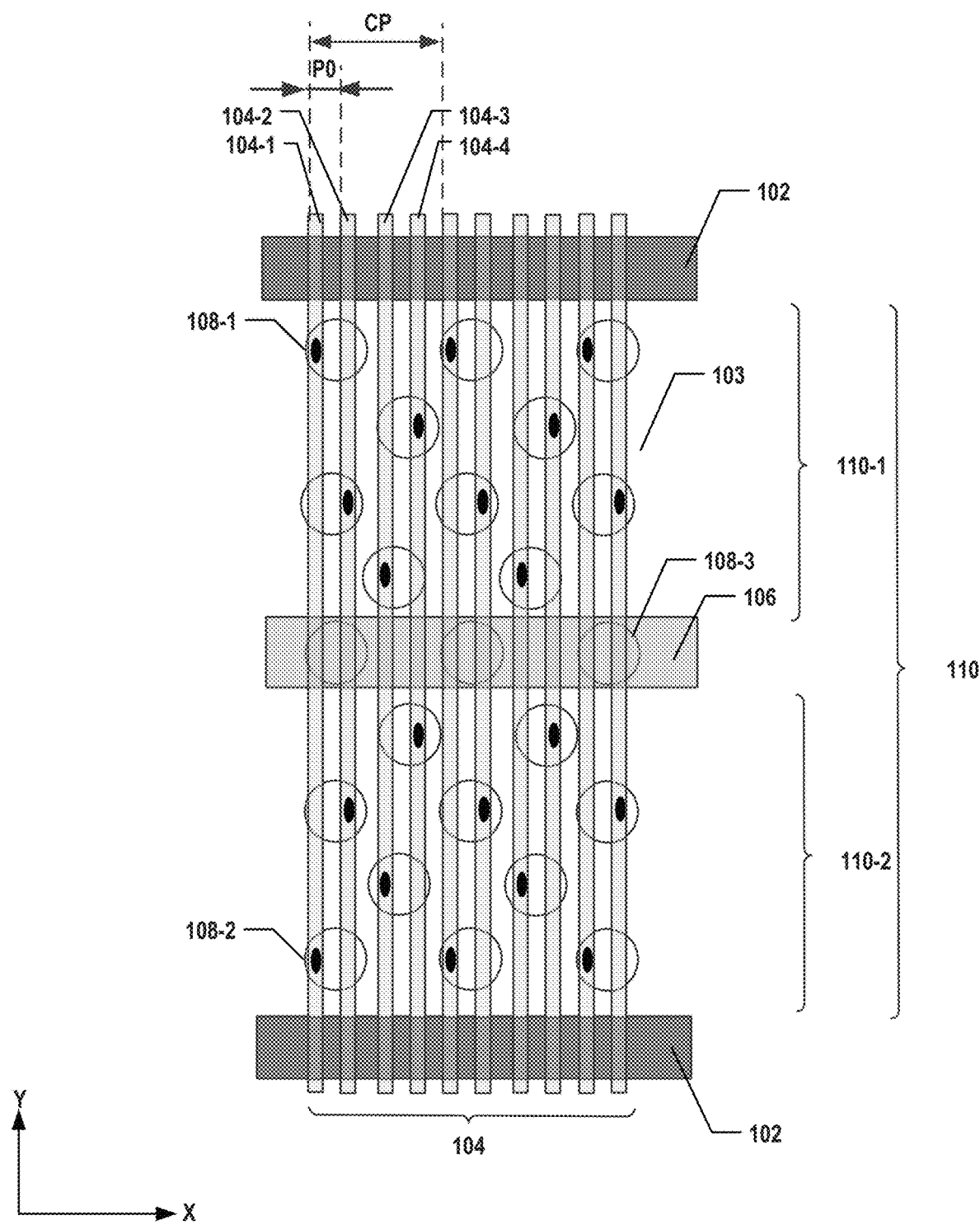
FIG. 1 illustrates a plan view of a 3D memory device.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). As used herein, the terms "over" and "above" are employed to describe the spatial relationship between bit lines and memory strings. In some embodiments, the description of "a bit line over a memory string" or similar refers to the spatial relationship of which the bit line is loosely over the memory string, and the orthogonal projections of the bit line and the memory string may or may not have overlaps on a lateral plane. In some embodiments, the description of "a bit line above a memory string" or similar refers to the spatial relationship of which the orthogonal projections of the bit line and the memory string have at least partial overlaps on a lateral plane.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the x-direction (or the x-axis) and the y-direction (or the y-axis) represent two orthogonal lateral directions. As used herein the z-direction (or the z-axis) represents a direction/axis that is perpendicular to the x-direction and the y-direction. As used herein, the term "vertical/vertically" means nominally perpendicular to the lateral surface of a substrate.

Figure 2:
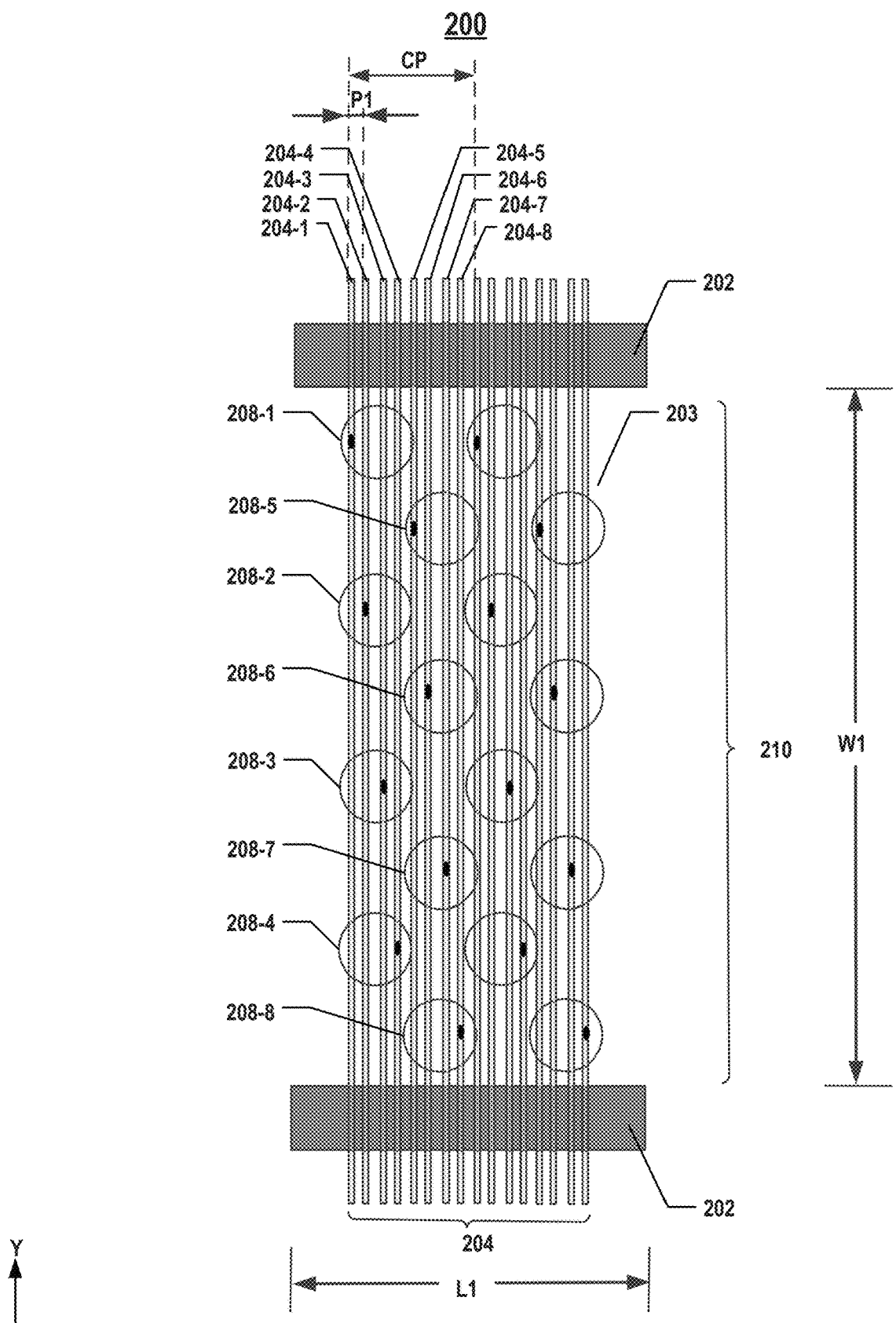
FIGS. 2-4 each illustrates a plan view of an exemplary 3D memory device, according to some embodiments of the present disclosure.
Figure 3:
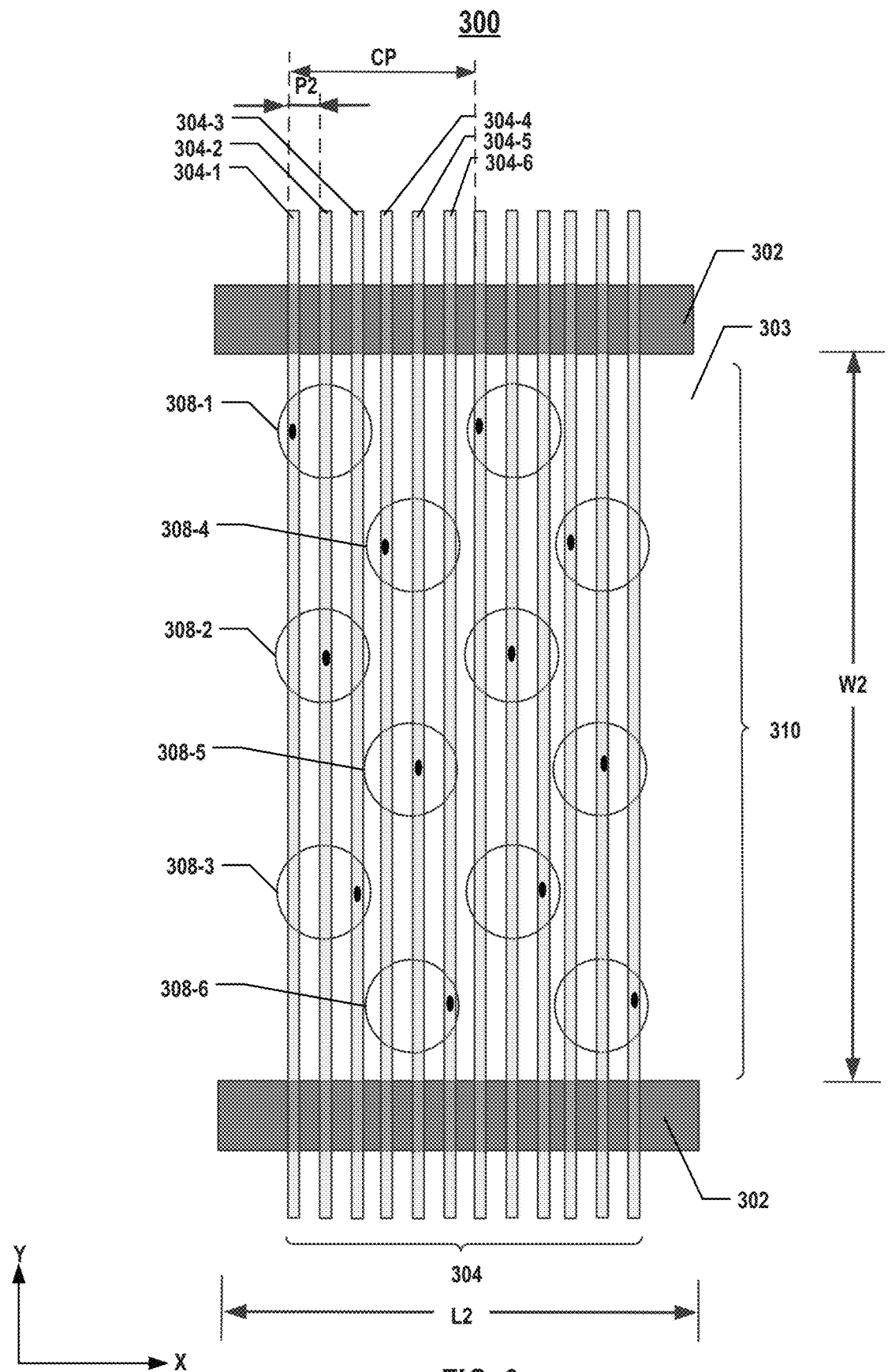
Figure 4:
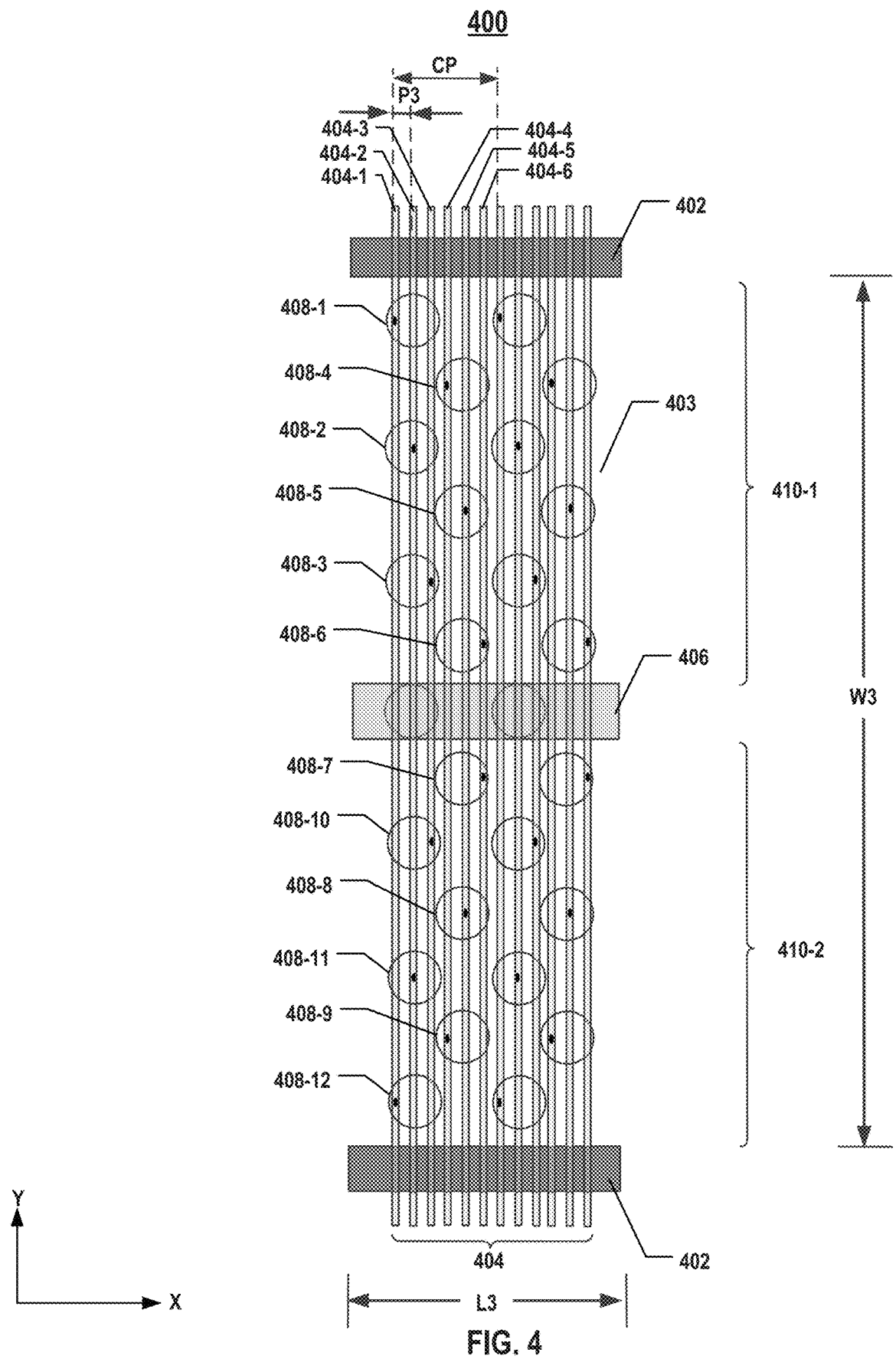

In the present disclosure, plan views are employed to depict the electrical and spatial relationship between components (e.g., bit lines and memory strings). In some embodiments, as shown in FIGS. 2-4, the connection between a bit line and a memory string is shown as the connection between an upper portion (e.g., the drain) of the memory string and the bit line in the plan view.

In a 3D memory device, GLSs divide an array region into multiple memory regions (e.g., fingers) for data access and storage. memory strings, often arranged as an array, are distributed in a memory region, forming memory cells for various data operations such as read, write, and erase. A memory string often includes a channel structure, a drain at an upper portion of the memory string over the channel structure, and a source at a lower portion of the memory string below the channel structure. The source is part of or electrically connected to an array common source (ACS) of the memory strings in the memory region. Bit lines are arranged in parallel over the channel structures and across the GLSs. The drain is electrically connected to one of the bit lines. A memory region often includes a top select gate cut (TSG cut, often includes a dielectric material) that divides a memory region into two even sub-regions (e.g., pages). A bit line is electrically connected to a memory string in one page and another memory string in the other page so a data operation can be performed in the memory cells of one page at a time. In a plan view, often four bit lines are arranged in a channel pitch (e.g., a lateral distance between adjacent channel structures or between adjacent memory strings) in each page so a bit line pitch (e.g., a lateral distance between two adjacent bit lines) is nominally equal to ¼ of a channel pitch.

FIG. 1 illustrates a plan view of a 3D memory device 100. As shown in FIG. 1, in 3D memory device 100, a plurality of memory strings 108 (e.g., 108-1, 108-2, and 108-3) is distributed as an array extending along a first lateral direction (e.g., the x-direction) and a second lateral direction (e.g., the y-direction) in memory region 110 (e.g., memory finger). Memory strings 108 extend vertically and laterally in a memory stack 103 of interleaved conductor layers and insulating layers. GLSs 102 extend along the first lateral direction and separate memory region 110 from other devices/regions. TSG cut 106 extends along the first lateral direction and divides memory region 110 into pages 110-1 and 110-2. Each page 110-1/110-2 includes four string rows (e.g., rows of memory strings 108) extending along the first lateral direction. In a plan view, TSG cut 106 overlaps with a string row (e.g., including memory string 108-3) between pages 110-1 and 110-2. A plurality of bit lines 104 extend along the second lateral direction across memory region 110. Each bit line 104 is electrically connected to a memory string 108 in page 110-1 and another memory string 108 in page 110-2. For example, bit line 104-1 is electrically connected to memory string 108-1 in page 110-1 and memory string 108-2 in page 110-2.

As shown in FIG. 1, a channel pitch CP refers to the lateral distance between two adjacent memory strings 108 along a lateral direction (e.g., the first lateral direction). A bit line pitch P0 refers to the lateral distance between two adjacent bit lines 104 along a lateral direction (e.g., the first lateral direction). In a plan view, as shown in FIG. 1, four bit lines 104-1, 104-2, 104-3, and 104-4 are arranged in a channel pitch CP, electrically connected to four memory strings in each page 110-1/110-2. Bit line pitch P0 is nominally equal to ¼ of channel pitch CP.

3D memory device 100 can have some drawbacks. For example, the number of functional memory strings 108 (or functional memory cells) between GLSs 102 can be limited by the area occupied by TSG cut 106 and the number of string rows in each page 110-1/110-2. As shown in FIG. 1, TSG cut 106 is located between pages 110-1 and 110-2, resulting in a non-functional string row (e.g., the string row that memory string 108-3 is located in) between pages 110-1 and 110-2. At a given time, four memory strings 108 in a channel pitch CP of one page (e.g., 110-1 or 110-2) can be accessed. A page size (e.g., data capacity) of page 110-1/110-2 is limited by bit line pitch P0, which is nominally ¼ of channel pitch CP. One way to increase the page size is to increase the number of memory strings 108 along the first lateral direction. However, this approach can increase the dimension of the conductor layers along the first lateral direction, causing increased read time and program time of the 3D memory device.

Various embodiments in accordance with the present disclosure provide architectures of 3D memory devices that have reduced bit line pitches and increased bit densities, thus an increased number of bit lines in the memory region. Bit density is herein defined as the number of data bits (or data capacity) per unit area. In some embodiments, each bit line arranged in a channel pitch is electrically connected to a single memory string in the memory region, and no TSG cut needs to be formed in the memory region. The respective 3D memory devices may function without any TSG cuts, increasing the bit density of the memory region. In a plan view, at least six bit lines are arranged in a channel pitch, allowing at least six memory strings to be formed in the channel pitch. This architecture can also desirably reduce the dimension of conductor layers along the first lateral direction, thus reducing RC time constant of the conductor layers and resulting in faster read and program operations. More memory strings (or memory cells) can be accessed at a given time, increasing page size and data throughput.

In some embodiments, a 3D memory device includes one or more TSG cuts between GLSs and an increased number of bit lines arranged in each channel pitch. The TSG cuts can divide the memory region into two or more pages. As an example, one TSG cut is formed between GLSs to form two pages in the memory region, and six or more bit lines can be arranged in a channel pitch. Each bit line may be electrically connected to one memory string in one page and another memory string in the other page. This architecture allows six or more string rows to be accessed at a given time in the respective page, increasing bit density and page size. Similarly, dimension of conductor layers along the first lateral direction can be reduced, resulting faster read and program operations.

FIG. 2 illustrates a plan view of an exemplary 3D memory device 200, according to some embodiments of the present disclosure. 3D memory device 200 may include a memory stack 203 that has a memory region 210 (e.g., a finger), one or more slit structures 202 (e.g., GLSs) along a boundary of memory region 210, a plurality of memory strings 208 (such as NAND memory strings) distributed in memory region 210, and a plurality of bit lines 204 arranged in parallel over memory strings 208 along the second lateral direction. At least one of bit lines 204 is electrically connected to a single memory string 208. In some embodiments, each bit line 204 is electrically to a single different memory string 208. In some embodiments, no TSG cut is formed in memory region 210 (e.g., no TSG cut overlaps with any memory strings 208 in the plan view). Memory string 208 may include a channel structure, a drain at an upper portion of memory string 208 and over the channel structure, and a source at a lower portion of memory string 208 and below the channel structure. The source is part of or electrically connected to an ACS of memory strings 208 in the memory region. The drain is electrically connected to a respective bit line 204. Without further illustration, memory strings 308 and 408 depicted in FIGS. 3 and 4 have similar or same structures.

As shown in FIG. 2, memory strings 208 may be arranged in an array extending along the first lateral direction and the second lateral direction. Memory strings 208 may be arranged in a plurality of string rows along the second lateral direction and a plurality of string columns along the first lateral direction. Bit lines 204 may extend along the second lateral direction over memory strings 208. In some embodiments, a channel pitch CP includes N memory strings, arranged in N string rows along the second lateral direction. Memory strings 208 in adjacent string rows may be arranged in a staggered pattern, as shown in FIG. 2. In some embodiments, in a plan view, N bit lines are arranged in channel pitch CP between slit structures 202. Each of the N bit lines is electrically connected to a single different memory string 208. The N bit lines are evenly spaced in channel pitch CP. In some embodiments, a bit line pitch P1 is nominally equal to 1/N of channel pitch CP. 3D memory device 200 may allow memory strings 208 in memory region 210 to be accessed at the same time during a data operation. Compared to 3D memory device 100, the lateral dimension of bit line 204 along the first lateral direction is reduced, the number of bit lines in a channel pitch doubles, and data throughput and page size each also doubles. Because no TSG cut is formed in memory region 210, bit density of 3D memory device 200 may be increased by about 10% in one example.

For example, in the plan view, eight bit lines (e.g., 204-1, 204-2, 204-3, 204-4, 204-5, 204-6, 204-7, and 204-8) may be arranged in channel pitch CP, over and connected to eight memory strings (e.g., 208-1, 208-2, 208-3, 208-4, 208-5, 208-6, 208-7, and 208-8). In some embodiments, each bit line 204 is electrically connected to a single different memory string 208. As shown in FIG. 2, bit line 204-1 is electrically connected to memory string 208-1, bit line 204-2 is electrically connected to memory string 208-2, . . . , bit line 204-8 is electrically connected to memory string 208-8. Bit lines 204-1, . . . , 204-8 may be evenly spaced, and bit line pitch P1 may be nominally equal to ⅛ of channel pitch CP.

In some embodiments, four bit lines 204 are arranged above each memory string 208. In the present disclosure, a bit line being above a memory string can refer to the orthogonal projections of the bit line the memory string being at least partially overlapping with one another in the lateral plane (e.g., the x-y plane). For example, bit lines 204-1, 204-2, 204-3, and 204-4 may be above each of memory strings 208-1, 208-2, 208-3, and 208-4; and bit lines 204-5, 204-6, 204-7, and 204-8 may be above each of memory strings 208-5, 208-6, 208-7, and 208-8. In some embodiments, bit lines 204 are formed by a multi-patterning process. In some embodiments, the number of bit lines 204 arranged in channel pitch CP is determined based on design and fabrication processes. The number of bit lines 204 arranged in channel pitch CP may be even or odd. In some embodiments, the number is an even integer of at least 6. By forming more bit lines 204 in channel pitch CP, more memory strings 208 can be accessed at a given time, increasing page size of the 3D memory device.

The formation of TSG cuts is optional in this architecture. When no TSG cut is formed, finger width W1 (e.g., lateral distance between GLSs along the second lateral direction) is reduced. At a given page size, less area in memory region 210 may be used for forming memory strings 208, resulting in a reduced finger length L1 (e.g., lateral distance of a finger along the first lateral direction). Accordingly, the dimension of conductor layers of memory stack 203 along the first lateral dimension can be reduced, causing reduced RC time constant of the conductor layers. The device response time (e.g., response time for data operations such as read and program operations) can be reduced.

FIG. 3 illustrates a plan view of another 3D memory device 300, according to some embodiments of the present disclosure. 3D memory device 300 may include a memory stack 303 that has a memory region 310 (e.g., a finger), one or more slit structures 302 (e.g., GLSs) 302 along a boundary of memory region 310, a plurality of memory strings 308 (or memory strings 308) distributed in memory region 310, and a plurality of bit lines 304 arranged in parallel over memory strings 308 along the second lateral direction. At least one of bit lines 304 is electrically connected to a single memory string 308. In some embodiments, each bit line 304 is electrically to a single different memory string 308. In some embodiments, no TSG cut is formed in memory region 310 (e.g., no TSG cut overlaps with any memory strings 308 in the plan view).

Different from 3D memory device 200, in the plan view, six bit lines 304 (e.g., 304-1, 304-2, 304-3, 304-4, 304-5, and 304-6) may be arranged in a channel pitch CP, over and electrically connected to six memory strings 308 (e.g., 308-1, 308-2, 308-3, 308-4, 308-5, and 308-6). For example, bit line 304-1 is electrically connected to memory string 308-1, bit line 304-2 is electrically connected to memory string 308-2, . . . , bit line 304-6 is electrically connected to memory string 308-6. Bit lines 304-1, . . . , 304-6 may be evenly spaced, and a bit line pitch P2 may be nominally equal to ⅙ of channel pitch CP. In some embodiments, three bit lines 304 are arranged above each memory string 308. For example, bit lines 304-1, 304-2, and 304-3 may be above each of memory strings 308-1, 308-2, and 308-3; and bit lines 304-5, 304-6, and 304-7 may be above each of memory strings 308-4, 308-5, and 308-6. In some embodiments, bit lines 304 are formed by a multi-patterning process.

Compared to 3D memory device 100, bit line pitch P2 is reduced to ⅙ of channel pitch CP and no TSG cut is formed in memory region 310. Finger length L2 and finger width W2 of memory region 310 may both be reduced. Page size and data throughout may each be increased by about 50%. Given the same page size, the RC time constant of conductor layers may be reduced by at least 60%. In some embodiments, bit density of 3D memory device 300 is similar to 3D memory device 100.

In some embodiments, no TSG cuts are formed in memory regions (e.g., fingers) 210 and 310, and conductor layers extend continuously along the x-direction and/or the y-direction. That is, at least the first conductor layer (e.g., the conductor on the topmost portion of the conductor layers) may extend continuously along a lateral direction it extends. In some embodiments, the first conductor layer extends continuously along a lateral direction it extends. In some embodiments, one or more conductor layers under the first conductor layer extend continuously along a lateral direction they extend. In some embodiments, all conductor layers extend continuously along a lateral direction they extend.

FIG. 4 illustrates a plan view of another 3D memory device 400, according to some embodiments of the present disclosure. 3D memory device 400 may include a memory stack 403 that has a memory region 410, one or more slit structures (or GLSs) 402 along a boundary of memory region 410, a plurality of memory strings 408 (or memory strings 408) distributed in memory region 410, a TSG cut 406 (or cut structure) extending along the first lateral direction, and a plurality of bit lines 404 arranged in parallel over memory strings 408 along the second lateral direction. TSG cut 406 may divide memory region 410 into memory sub-regions (410-1 and 410-2 (e.g., memory pages), each including a portion of the array of memory strings 408. In some embodiments, in the plan view, TSG cut 406 overlaps with a string row along the second lateral direction and divides the array of memory strings 408 into two even portions (e.g., two portions with the same number of memory strings 408 and/or same/symmetric arrangement of memory strings 408).

In some embodiments, in the plan view, each bit line 404 is electrically connected to one memory string 408 in memory sub-region 410-1 and another memory string 408 in memory sub-region 410-2. Each memory string 408 in the same memory sub-region 410-1/410-2 may be electrically connected to a different bit line 404. In the plan view, N bit lines are arranged in channel pitch CP. The number of memory strings 408 arranged in channel pitch in each memory sub-region 410-1/410-2 (e.g., between GLS 402 and TSG cut 406) may be equal to N. N may be at least 6. In some embodiments, the N bit lines are evenly arranged in channel pitch CP, and a bit line pitch P3 is nominally equal to 1/N of channel pitch CP. In some embodiments, memory region 410 includes 13 string rows, and each of memory sub-regions 410-1 and 410-2 includes six string rows extending along the second lateral direction. In some embodiments, 3 bit lines are above each memory string 408 in the plan view.

For example, as shown in FIG. 4, bit lines 404-1, 404-2, 404-3, 404-4, 404-5, and 404-6 may be arranged in channel pitch CP and over memory strings 408-1, 408-2, ..., and 408-6 in memory sub-region 410-1 and memory strings 408-7, 408-8, ..., and 408-12 in memory sub-region 410-2. Bit line 404-1 may be electrically connected to memory strings 408-1 and 408-12, bit line 404-2 may be electrically connected to memory strings 408-2 and 408-11, bit line 404-3 may be electrically connected to memory strings 408-3 and 408-10, bit line 404-4 may be electrically connected to memory strings 408-4 and 408-9, bit line 404-5 may be electrically connected to memory strings 408-5 and 408-8, and bit line 404-6 may be electrically connected to memory strings 408-6 and 408-7. In some embodiments, bit lines 404-1, 404-2, and 404-3 may be above each of memory strings 408-1, 408-2, 408-3, 408-10, 408-11, and 408-12. In some embodiments, bit lines 404-4, 404-8, and 404-6 may be above each of memory strings 408-4, 408-5, 408-6, 408-7, 408-8, and 408-9.

Compared to 3D memory device 100, bit line pitch P3 is reduced to ⅙ of channel pitch CP and TSG cut is formed in memory region 410. Page size and data throughout may each be increased by about 50%. In some embodiments, bit density of 3D memory device 400 is increased by about 10% compared to 3D memory device 100.

Figure 5A:
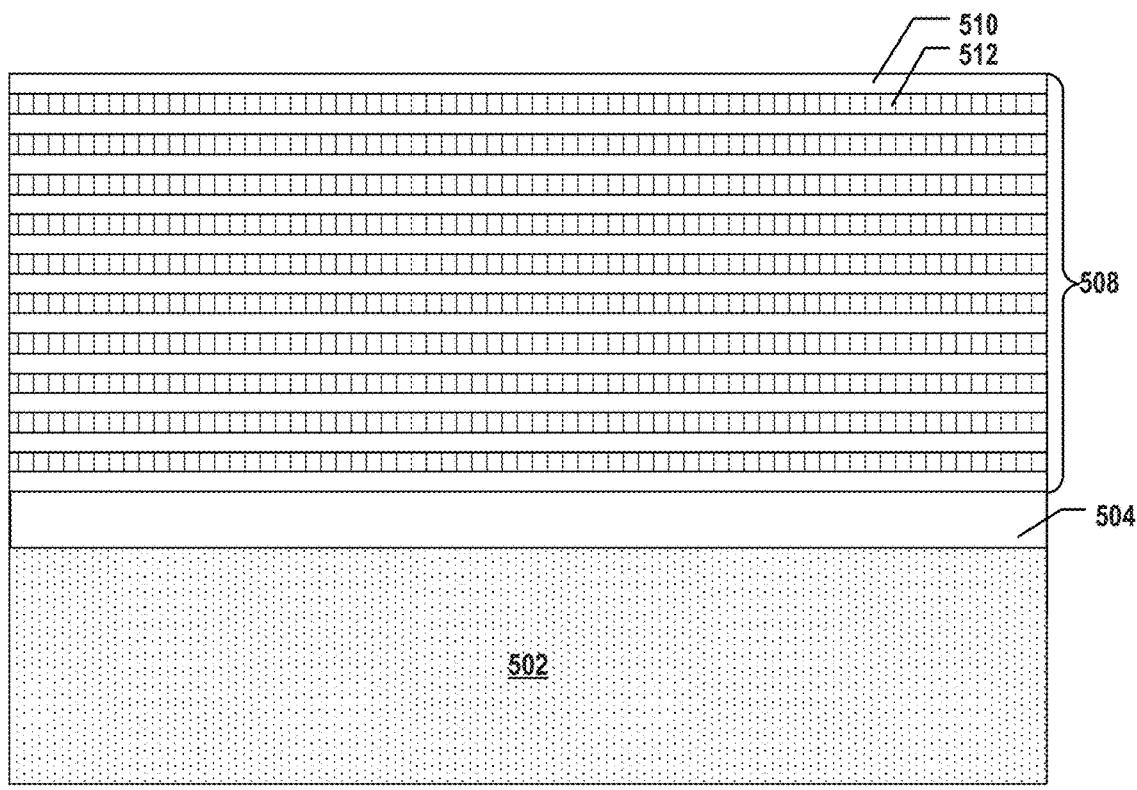
FIGS. 5A-5C illustrate cross-sectional views of a 3D memory device at various stages of an exemplary fabrication process, according to some embodiments of the present disclosure.
Figure 5B:
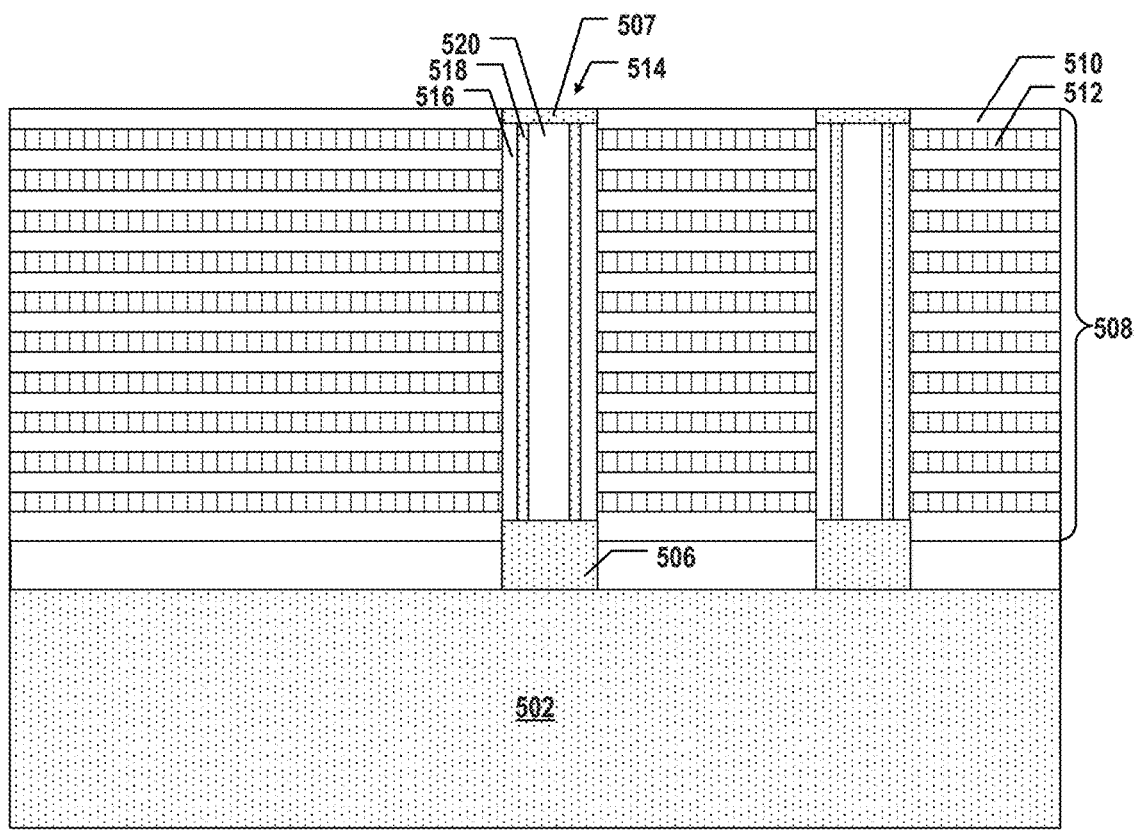
Figure 5C:
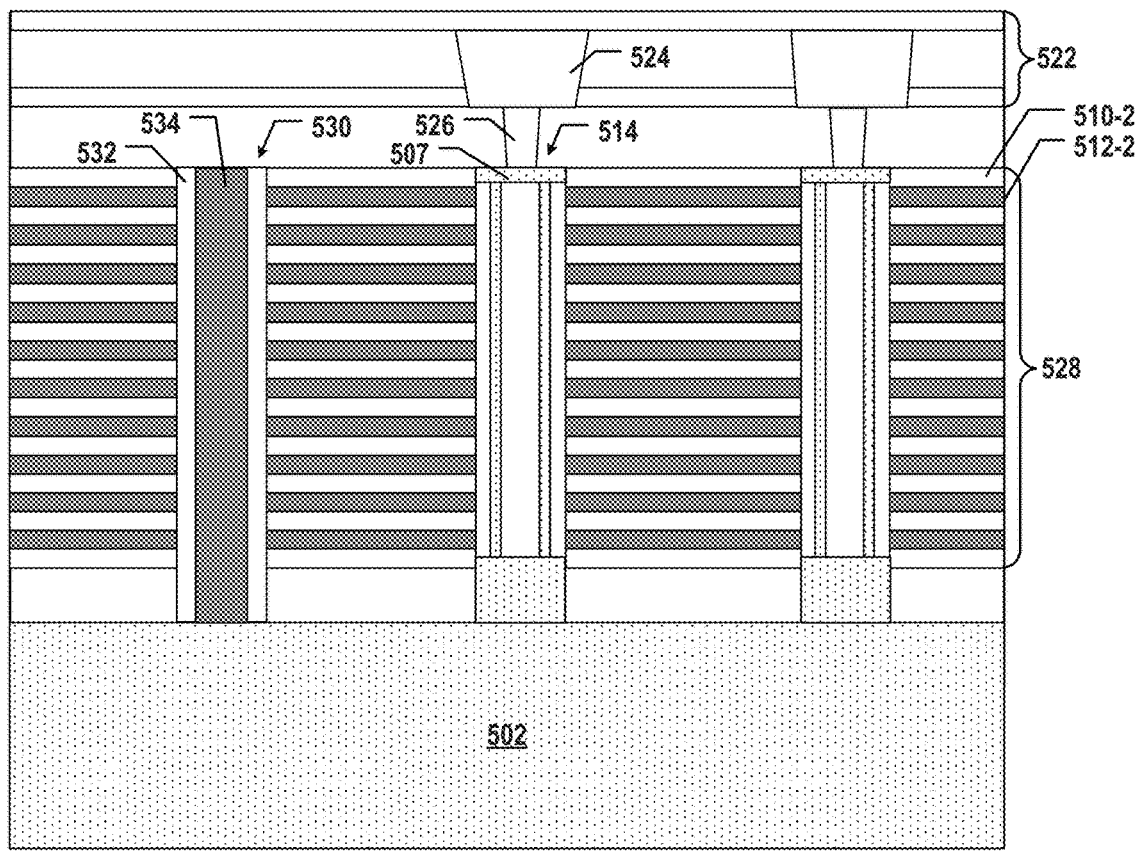
Figure 6:
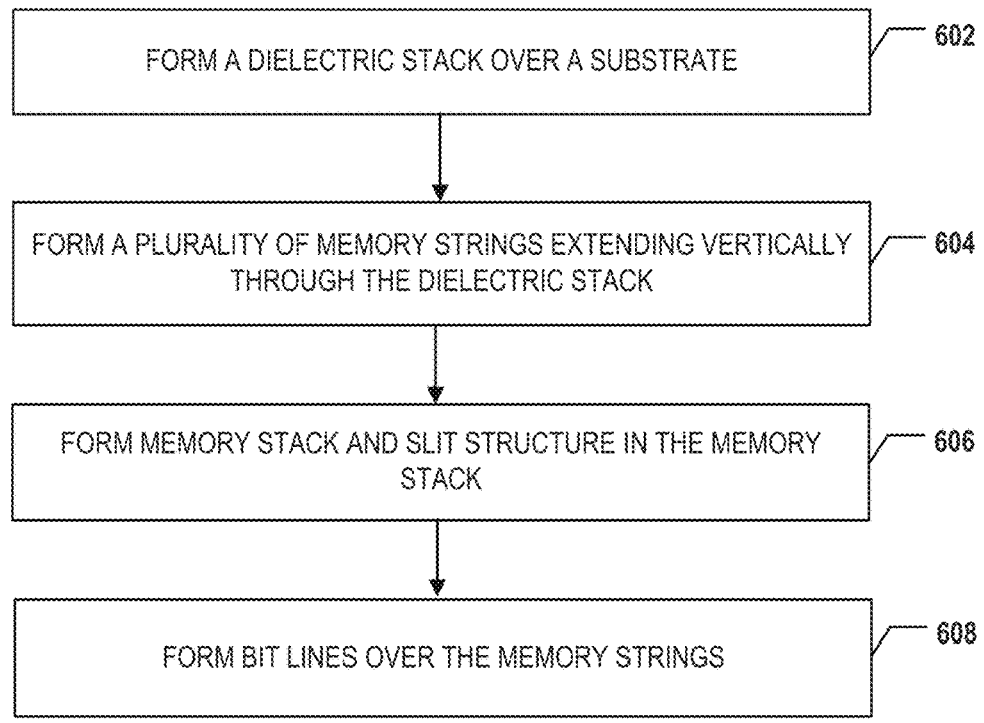
FIG. 6 is a flowchart of an exemplary method for forming a 3D memory device, according to some embodiments of the present disclosure.
Figure 7:
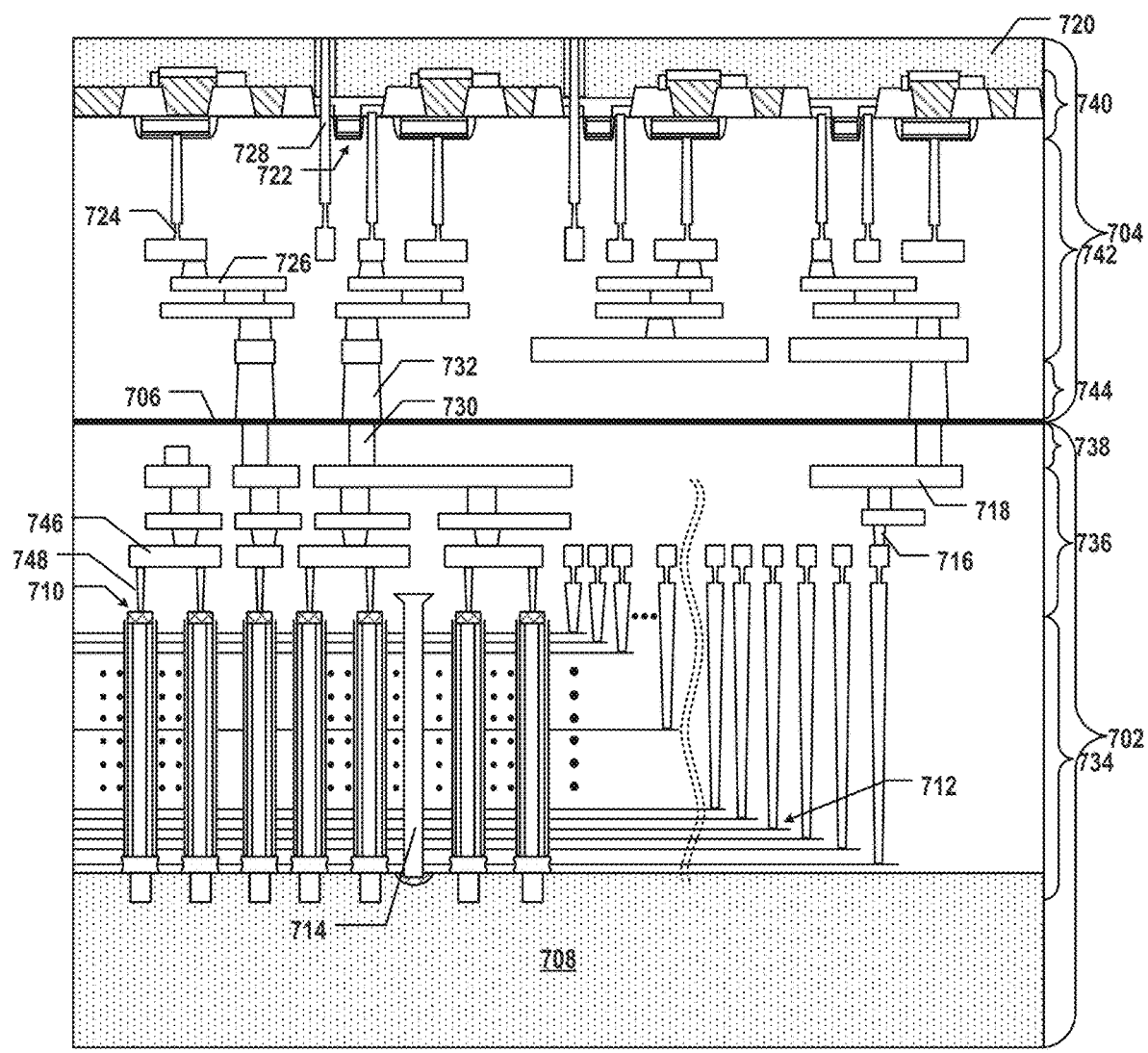
FIG. 7 illustrates a cross-sectional view of an exemplary memory system having an exemplary 3D memory device, according to some embodiments of the present disclosure.

FIGS. 5A-5C illustrate cross-sectional views of a 3D memory device at various stages of an exemplary fabrication process, according to some embodiments of the present disclosure. FIG. 6 is a flowchart describing fabrication method 600 that forms a 3D memory device. The specific order and fabrication methods of operations 602-608 are subjected to different designs and fabrication requirements, and should not be limited by the embodiments of the present disclosure. FIG. 7 is an exemplary system 700 (e.g., a bonded semiconductor device) that includes a 3D memory device described in the present disclosure.

It is noted that x and y axes/directions are included in FIGS. 5A-5C and FIG. 7 to further illustrate the spatial relationship of the components in 3D memory device having a substrate 502 and system 700 having a substrate 708. Substrate 502 and substrate 708 each includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a semiconductor device (e.g., 3D memory device or bonded semiconductor device) is determined relative to the substrate of the semiconductor device (e.g., substrate 502 or substrate 708) in the y-direction (i.e., the vertical direction) when the substrate is positioned in the lowest plane of the semiconductor device in the y-direction. The same notion for describing spatial relationship is applied throughout the present disclosure.

Referring to FIG. 6, method 600 includes operation 602, in which a dielectric stack is formed on a substrate. The substrate which can include silicon (e.g., single crystalline silicon), silicon germanium (SiGe), gallium arsenide (GaAs), germanium (Ge), silicon on insulator (SOI), or any other suitable materials. The dielectric stack can include a plurality of dielectric/sacrificial layer pairs.

As illustrated in FIG. 5A, pairs of a first dielectric layer 510 and a second dielectric layer (known as a "sacrificial layer") 512 (together referred to herein as "dielectric layer pairs") are formed over a substrate 502. The stacked dielectric layer pairs can form a dielectric stack 508. In some embodiments, an isolation layer 504, such as a silicon oxide film, is formed between substrate 502 and dielectric stack 508. Dielectric stack 508 can include an alternating stack of sacrificial layer 512 and dielectric layer 510 that is different from sacrificial layer 512. In some embodiments, each dielectric layer pair includes a layer of silicon nitride and a layer of silicon oxide. In some embodiments, sacrificial layers 512 can each have the same thickness or have different thicknesses. Similarly, dielectric layers 510 can each have the same thickness or have different thicknesses. Isolation layer 504 and dielectric stack 508 can be formed by one or more thin film deposition processes including, but not limited to, chemical vapor deposition (CVD), physical vapor deposition (PVD), atomic layer deposition (ALD), or any combination thereof.

Method 600 proceeds to operation 604, as illustrated in FIG. 6, in which a plurality of memory strings each extending vertically through the dielectric stack are formed. As illustrated in FIG. 5B, memory strings 514 are formed on substrate 502, each of which extends vertically through dielectric stack 508 and above substrate 502. In some embodiments, each memory string 514 can include a lower semiconductor plug 506 and an upper semiconductor plug 507 at its lower portion and upper portion, respectively. Lower semiconductor plug 506 can be at least part of the source of memory string 514 (e.g., ACS of the memory strings in the respective memory region). In some embodiments, fabrication processes to form memory string 514 include etching a channel hole through dielectric stack 508 and forming lower semiconductor plug 506 at the lower portion of the channel hole. The channel hole can be formed by dry etching and/or wet etching, such as deep reactive ion etching (RIE), and lower semiconductor plug 506 can be epitaxially grown from substrate 502 into the lower portion of the channel hole.

In some embodiments, fabrication processes to form memory string 514 also include forming a memory film 516 along the sidewalls of the channel hole. Memory film 516 can be a combination of multiple dielectric layers including, but not limited to, a tunneling layer, a storage layer, and a blocking layer. Tunneling layer can include dielectric materials including, but not limited to, silicon oxide, silicon nitride, silicon oxynitride, or any combination thereof. Storage layer can include materials for storing charge for memory operation. The storage layer materials can include, but not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon oxynitride/silicon oxide (ONO). The blocking layer can further include a high-k dielectric layer, such as an aluminum oxide layer.

In some embodiments, fabrication processes to form memory string 514 also include forming a semiconductor channel 518 over memory film 516 and forming a filling layer 520 over semiconductor channel 518 to partially or fully fill the remaining space of the channel hole. Semiconductor channel 518 can include semiconductor materials, such as polysilicon. Filling layer 520 can include dielectric materials, such as silicon oxide. Filling layer 520, semiconductor channel 518, and memory film 516 can be formed by processes such as ALD, CVD, PVD, any other suitable processes, or any combination thereof.

In some embodiments, upper semiconductor plug 507 is formed at the upper portion of memory string 514 as the drain of memory string 514. Upper semiconductor plug 507 can be formed by etching back the upper portion of memory string 514 by dry etching and/or wet etching, followed by one or more deposition processes, such as ALD, CVD, PVD, any other suitable processes, or any combination thereof, to deposit a semiconductor material, such as polysilicon, into the recess formed by the etching-back process.

Method 600 proceeds to operation 606, as illustrated in FIG. 6, in which a memory stack is formed from the dielectric stack and slit structure is formed in the memory stack. As illustrated in FIG. 5C, a slit structure 530 is formed to extend vertically in a memory stack 528 formed from dielectric stack 508. Slit structure 530, corresponding to the slit structures 202, 302, and 402 depicted in FIGS. 2-4, may include a dielectric structure 532 and a source contact 534 in dielectric structure 532. Source contact 534 may extend to substrate 502 and be electrically connected to the ACS of memory strings 514. In some embodiments, dielectric stack 508 is repetitively etched to form a staircase structure of dielectric/sacrificial layer pairs. A slit opening may be formed in the staircase structure, exposing substrate 502. The slit opening may correspond to slit structure 530. The etched sacrificial layers may then be replaced, with a plurality of conductor layers, in the dielectric/sacrificial layer pairs through the slit opening to form a plurality of conductor/dielectric layer pairs (e.g., 510-2/512-2). The conductor layers 512-2 may include any suitable conductive material such as tungsten, copper, aluminum, and/or cobalt. In some embodiments, the slit opening is filled with a dielectric material, and a conductive material is formed in the dielectric material, forming dielectric structure 532 and source contact 534. Source contact may be electrically connected to the ACS of memory strings 514. The dielectric structure may include any suitable dielectric materials such as silicon oxide, silicon nitride, and/or silicon oxynitride. The source contact may be made of any suitable conductive material such as tungsten, copper, cobalt, aluminum, silicon, and/or silicides. In some embodiments, word line via contacts (or via contacts) that are electrically connected to conductor layers 512-2 are formed.

Method 600 proceeds to operation 608, as illustrated in FIG. 6, in which a plurality of bit lines are formed over the memory strings. In some embodiments, at least one of the plurality of bit lines is electrically connected to a single one of the plurality of memory strings. In some embodiments, at least three bit lines are above one memory string. An array interconnect layer, including a plurality of interconnects in one or more inter-layer dielectric (ILD) layers, may be formed. As illustrated in FIG. 5C, an array interconnect layer 522 can be formed above dielectric stack 508 and memory strings 514. Array interconnect layer 522 can include interconnects, such as bit lines 524, in one or more ILD layers for transferring electrical signals to and from memory strings 514. In some embodiments, bit line contacts 526 can be formed in an ILD layer formed above memory stack 528 prior to forming array interconnect layer 522, such that each bit line contact 526 is above and in contact with upper semiconductor plug 507 (the source) of corresponding memory string 514 and is below and in contact with corresponding bit line 524. In some embodiments, the arrangement and layout of bit line 524 may be referred to the description of bit lines 204, 304, and 404 in FIGS. 2-4 and is not repeated herein.

In some embodiments, array interconnect layer 522 includes multiple ILD layers and interconnects therein formed in multiple processes. For example, bit lines 524 can include conductive materials deposited by one or more thin film deposition processes including, but not limited to, CVD, PVD, ALD, electroplating, electroless plating, or any combination thereof. Fabrication processes to form bit lines 524 can also include photolithography, chemical mechanical polishing (CMP), wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 5C can be collectively referred to as an "interconnect layer" (e.g., array interconnect layer 522).

The formed memory stack may be coupled with other parts of a memory system for operations such as read, write, and erase. FIG. 7 illustrates a cross-sectional view of a system 700 that includes the 3D memory device formed by fabrication method 600. System 700 may include a bonded semiconductor device.

System 700 represents an example of a memory system that includes a 3D memory device, according to embodiments of the present disclosure. System 700 can include a substrate 708, which can include silicon (e.g., single crystalline silicon), silicon germanium (SiGe), gallium arsenide (GaAs), germanium (Ge), silicon on insulator (SOI), or any other suitable materials. System 700 can include two semiconductor structures, i.e., a memory array device chip 702 that includes a 3D memory device described in any of FIGS. 2-4 and a peripheral device chip 704 bonded on top of memory array device chip 702 in a face-to-face manner at a bonding interface 706. It should be noted that peripheral device chip 704 is used herein merely as an example for illustration of components of the system. In some embodiments, peripheral devices are formed on the same substrate as the 3D memory device, either stack above or below the 3D memory device or on the side of the 3D memory device. In some embodiments, bonding interface 706 is disposed between memory array device chip 702 and peripheral device chip 704 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 706 is the place at which memory array device chip 702 and peripheral device chip 704 are met and bonded. In practice, bonding interface 706 can be a layer with a certain thickness that includes the top surface of memory array device chip 702 and the bottom surface of peripheral device chip 704.

In some embodiments, memory array device chip 702 is a NAND Flash memory device in which memory cells are provided in the form of an array of memory strings 710 (e.g., NAND memory strings) in a memory array device layer 734. Memory array device layer 734 can be disposed on substrate 708. In some embodiments, each memory string 710 extends vertically through a plurality of pairs each including a conductor layer and a dielectric layer (referred to herein as "conductor/dielectric layer pairs"). The stacked conductor/dielectric layer pairs are collectively referred to herein as a memory stack 712 in memory array device layer 734. The conductor layers and dielectric layers in memory stack 712 can stack alternatingly in the vertical direction. Each memory string 710 can include a semiconductor channel and a composite dielectric layer (also known as a "memory film") including a tunneling layer, a storage layer (also known as a "charge trap/storage layer"), and a blocking layer (not shown). The structure of memory strings 710 may be the same as or similar to memory strings 514 described in FIG. 514, and the lateral arrangement of memory strings 710 may be referred to the lateral arrangement of semiconductor channels/memory strings (e.g., 208, 308, and 408) described in FIGS. 2-4. In some embodiments, memory array device layer 734 further includes a gate line slit ("GLS") or slit structure 714 that extends vertically through memory stack 712. GLS 714 can be used to form the conductor/dielectric layer pairs in memory stack 712 by a gate replacement process and can be filled with conductive materials for electrically connecting ACS of memory strings 710.

In some embodiments, memory array device chip 702 also includes an array interconnect layer 736 above memory array device layer 734 for transferring electrical signals to and from memory strings 710. As shown in FIG. 7, array interconnect layer 736 can include a plurality of interconnects (also referred to herein as "contacts"), including vertical interconnect access (via) contacts 716 and lateral interconnect lines 718. As used herein, the term "interconnects" can broadly include any suitable types of interconnects, such as middle-end-of-line (MEOL) interconnects and back-end-of-line (BEOL) interconnects. Array interconnect layer 736 can further include one or more interlayer dielectric (ILD) layers (also known as "intermetal dielectric (IMD) layers") in which bit lines 746, bit line contacts 748, interconnect lines 718, and via contacts 716 can form. Bit line contact 748 may be positioned between bit line 746 and memory string 710. Bit line contact 748 may be electrically connected to bit line 746 and an upper portion of memory string 710 (e.g., drain of memory string 710) to transmit signals/data between bit line 746 and memory string 710. Detailed description of bit lines 746 may be referred to the description of bit lines in FIGS. 2-4 and is not repeated herein.

As shown in FIG. 7, memory array device chip 702 can further include a bonding layer 738 at bonding interface 706 and above array interconnect layer 736 and memory array device layer 734. Bonding layer 738 can include a plurality of bonding contacts 730 and dielectrics electrically isolating bonding contacts 730. Bonding contacts 730 can include conductive materials including, but not limited to, tungsten, cobalt, copper, aluminum, silicides, or any combination thereof. The remaining area of bonding layer 738 can be formed with dielectrics including, but not limited to, silicon oxide, silicon nitride, silicon oxynitride, low-k dielectrics, or any combination thereof. Bonding contacts 730 and surrounding dielectrics in bonding layer 738 can be used for hybrid bonding.

Peripheral device chip 704 can include a plurality of transistors 722 in a peripheral device layer 740 disposed below a semiconductor layer 720, such as a thinned substrate. In some embodiments, peripheral device layer 740 can include any suitable digital, analog, and/or mixed-signal peripheral devices used for facilitating the operation of system 700. For example, the peripheral devices can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). The peripheral devices in peripheral device layer 740 can be electrically connected to memory strings 710 through one or more layers of interconnects.

Similar to memory array device chip 702, peripheral device chip 704 can also include a peripheral interconnect layer 742 disposed below peripheral device layer 740 for transferring electrical signals to and from transistors 722. Peripheral interconnect layer 742 can include a plurality of interconnects, including interconnect lines 726 and via contacts 724 in one or more ILD layers. In some embodiments, peripheral device chip 704 also includes via contacts 728 (e.g., through silicon vias (TSVs) if semiconductor layer 720 is a thinned silicon substrate) extending vertically through semiconductor layer 720. In some embodiments, peripheral device chip 704 further includes a BEOL interconnect layer (not shown) above transistors 722 and semiconductor layer 720. In some embodiments, the BEOL interconnect layer includes any suitable BEOL interconnects and contact pads that can transfer electrical signals between system 700 and external circuits.

As shown in FIG. 7, peripheral device chip 704 can further include a bonding layer 744 at bonding interface 706 and below peripheral interconnect layer 742 and peripheral device layer 740. Bonding layer 744 can include a plurality of bonding contacts 732 and dielectrics electrically isolating bonding contacts 732. Bonding contacts 732 can include conductive materials including, but not limited to, tungsten, cobalt, copper, aluminum, silicides, or any combination thereof. The remaining area of bonding layer 744 can be formed with dielectrics including, but not limited to, silicon oxide, silicon nitride, silicon oxynitride, low-k dielectrics, or any combination thereof. Bonding contacts 732 and surrounding dielectrics in bonding layer 744 can be used for hybrid bonding.

Embodiments of the present disclosure provide a 3D memory device. In some embodiments, the 3D memory device includes a substrate, a plurality of memory strings each extending vertically above the substrate in a memory region, and a plurality of bit lines over the plurality of memory strings. At least one of the plurality of bit lines is electrically connected to a single one of the plurality of memory strings.

In some embodiments, each one of the plurality of memory strings is electrically connected to a single different one of the plurality of bit lines.

In some embodiments, the 3D memory device further includes at least one slit structure extending laterally along a boundary of the memory region.

In some embodiments, the plurality of memory strings are arranged in an array extending along a first lateral direction and a second lateral direction in the memory region. The first lateral direction may be perpendicular to the second lateral direction. The plurality of bit lines may be arranged along the first direction and extends along the second lateral direction, being parallel with one another. In a plan view, a number of bit lines arranged in a channel pitch along the first lateral direction may be equal to a number of memory strings electrically connected to the bit lines along the second lateral direction.

In some embodiments, the array is arranged between two slit structures each laterally extending along the first direction. In the plan view, the number of bit lines arranged in the channel pitch may be equal to the number of memory strings in the channel pitch and between the two slit structures.

In some embodiments, in the plan view, the bit lines in the channel pitch are evenly spaced, a bit line pitch along the first lateral direction being nominally equal to 1/N of the channel pitch. N may be equal to the number of bit lines in the channel pitch.

In some embodiments, the array includes at least six string rows along the second lateral direction.

In some embodiments, N is a positive even integer.

In some embodiments, the plurality of memory strings each includes a channel structure and a drain over the channel structure. The drain may be electrically connected to a respective bit line.

In some embodiments, in a plan view, no cut structure overlaps with the plurality of memory strings in the memory region, the memory region being a finger.

In some embodiments, the 3D memory device further includes a plurality of interleaved conductor layers and insulating layers extending laterally and intersecting with the plurality of memory strings. A first conductor layer may extend continuously along a direction it extends in the memory region.

Embodiments of the present disclosure also provide another 3D memory device. The 3D memory device includes a substrate, and a plurality of memory strings extending along a first lateral direction and a second lateral direction in a plan view. Each of the plurality of memory strings extends vertically above the substrate in a memory region. The 3D memory device also includes a plurality of bit lines extending along the second lateral direction over the plurality of memory strings. The plurality of bit lines is nominally parallel to one another. The 3D memory device also includes a cut structure overlapping with at least one of the plurality of memory strings in the plan view and dividing the plurality of memory strings into a first portion and a second portion along the second lateral direction. A number of bit lines above at least one of the plurality of memory strings is at least three.

In some embodiments, the first portion and the second portion of the plurality of memory strings includes a same number of string rows along the second lateral direction and a same number of string columns along the first lateral direction. Each one of the plurality of bit lines may be electrically connected to one memory string in the first portion and another memory string in the second portion.

In some embodiments, the plurality of memory strings are arranged in an array extending along the first lateral direction and the second lateral direction, and each of the first portion and the second portion of the plurality of memory strings includes an even number of string rows along the second lateral direction.

In some embodiments, each of the first portion and the second portion includes N string rows along the second lateral direction, and a channel pitch includes N bit lines arranged along the first lateral direction. A bit line pitch may be nominally 1/N of the channel pitch along the first lateral direction. N may be equal to at least 6.

In some embodiments, N is a positive even integer.

In some embodiments, the plurality of memory strings each includes a channel structure and a drain over the channel structure, the drain being electrically connected to a respective bit line.

Embodiments of the present disclosure provide a 3D memory system. The 3D memory system includes a memory stack, a plurality of memory strings, a plurality of bit lines, and a plurality of peripheral devices. The memory stack may include a plurality of interleaved conductor layers and insulating layers in an insulating structure over a substrate. The plurality of memory strings may extend in the memory stack along a first lateral direction and a second lateral direction in a plan view, each of the plurality of memory strings extending vertically into the substrate. The plurality of bit lines may be over and electrically connected to the plurality of memory strings. In some embodiments, at least one of the plurality of bit lines is electrically connected to a single one of the plurality of memory strings. A plurality of peripheral devices may be electrically connected to the plurality of memory strings.

In some embodiments, each one of the plurality of memory strings is electrically connected to a single different one of the plurality of bit lines.

In some embodiments, the 3D memory system further includes at least one slit structure laterally extending along a boundary of the memory region.

In some embodiments, the plurality of memory strings is arranged in an array extending along the first lateral direction and the second lateral direction in the memory region. The first lateral direction may be perpendicular to the second lateral direction. In some embodiments, the plurality of bit lines is arranged along the first direction and extends along the second lateral direction, being parallel with one another. In the plan view, a number of bit lines arranged in a channel pitch along the first lateral direction may be equal to a number of memory strings electrically connected to the bit lines along the second lateral direction.

In some embodiments, the array is arranged between two slit structures each laterally extending along the first direction. In some embodiments, in the plan view, the number of bit lines arranged in the channel pitch is equal to the number of memory strings in the channel pitch and between the two slit structures.

In some embodiments, in the plan view, the bit lines in the channel pitch are evenly spaced. A bit line pitch along the first lateral direction may be nominally equal to 1/N of the channel pitch, N being equal to the number of bit lines in the channel pitch.

In some embodiments, the array includes at least six string rows along the second lateral direction.

In some embodiments, N is a positive even integer.

In some embodiments, the plurality of memory strings each includes a channel structure and a drain over the channel structure. The drain may be electrically connected to a respective bit line.

In some embodiments, in a plan view, no cut structure overlaps with the plurality of memory strings in the memory region, the memory region being a finger.

In some embodiments, the first conductor layer extends continuously along a direction it extends in the memory region.

Embodiments of the present disclosure provide a 3D memory system. The 3D memory system includes a memory stack, a plurality of memory strings, a cut structure, a plurality of bit lines, and a plurality of peripheral devices. The memory stack may include a plurality of interleaved conductor layers and insulating layers in an insulating structure over a substrate. The plurality of memory strings may extend in the memory stack along a first lateral direction and a second lateral direction in a plan view, each of the plurality of memory strings extending vertically into the substrate. The cut structure may overlap with at least one of the plurality of memory strings in the plan view and dividing the plurality of memory strings into a first portion and a second portion along the second lateral direction. The plurality of bit lines may be over and electrically connected to the plurality of memory strings. The plurality of bit lines may each be parallel to one another. A number of bit lines above at least one of the plurality of memory strings may be at least three. A plurality of peripheral devices may be electrically connected to the plurality of memory strings.

In some embodiments, the first portion and the second portion of the plurality of memory strings include a same number of string rows along the second lateral direction and a same number of string columns along the first lateral direction. In some embodiments, each one of the plurality of bit lines is electrically connected to one memory string in the first portion and another memory string in the second portion.

In some embodiments, the plurality of memory strings are arranged in an array extending along the first lateral direction and the second lateral direction. In some embodiments, each of the first portion and the second portion of the plurality of memory strings includes an even number of string rows along the second lateral direction.

In some embodiments, in the plan view, each of the first portion and the second portion includes N string rows along the second lateral direction. A channel pitch may include N bit lines arranged along the first lateral direction. A bit line pitch may be nominally 1/N of the channel pitch along the first lateral direction, N being equal to at least 6.

In some embodiments, N is a positive even integer.

In some embodiments, the plurality of memory strings each includes a channel structure and a drain over the channel structure, the drain being electrically connected to a respective bit line.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) memory device, comprising:
    forming a stack structure;
    forming a plurality of memory strings each extending vertically through a memory region of the stack structure; and
    forming a plurality of bit lines over the plurality of memory strings, such that at least one of the plurality of bit lines is electrically connected to a single one of the plurality of memory strings, wherein the plurality of memory strings are arranged in an array extending along a first lateral direction and a second lateral direction in the memory region, the first lateral direction being perpendicular to the second lateral direction, wherein the plurality of bit lines are arranged along the first lateral direction and extend along the second lateral direction, being parallel with one another, and in a plan view, a number of bit lines arranged in a channel pitch along the first lateral direction is at least six.

2. The method of claim 1, wherein
    forming the stack structure comprising forming a dielectric stack comprising stacked dielectric layer pairs; and
    the method further comprises after forming the plurality of memory strings, forming a memory stack from the dielectric stack, such that the plurality of memory strings each extends vertically through the memory region of the memory stack.

3. The method of claim 2, wherein
    the memory stack comprises a plurality of interleaved conductive layers and insulating layers extending laterally and intersecting with the plurality of memory strings;
    in the plan view, no cut structure overlaps with the plurality of memory strings in the memory region, the memory region being a finger; and
    a first conductor layer extends continuously along a direction it extends in the memory region.

4. The method of claim 1, wherein each one of the plurality of memory strings is electrically connected to a single different one of the plurality of bit lines.

5. The method of claim 1, further comprising forming at least one slit structure extending laterally along a boundary of the memory region.

6. The method of claim 5, wherein in the plan view, a number of bit lines arranged in a channel pitch along the first lateral direction is equal to a number of memory strings electrically connected to the bit lines along the second lateral direction.

7. The method of claim 5, wherein
    the array is arranged between two slit structures each laterally extending along the first lateral direction; and
    in the plan view, the number of bit lines arranged in the channel pitch is equal to the number of memory strings in the channel pitch and between the two slit structures.

8. The method of claim 7, wherein in the plan view, the bit lines in the channel pitch are evenly spaced, a bit line pitch along the first lateral direction being nominally equal to 1/N of the channel pitch, N being equal to the number of bit lines in the channel pitch.

9. The method of claim 5, wherein the array comprises at least six string rows along the second lateral direction.

10. The method of claim 9, wherein N is a positive even integer.

11. The method of claim 1, wherein forming the plurality of memory strings comprising, for each of the memory strings, forming a channel structure and a drain over the channel structure, the drain being electrically connected to a respective bit line.

12. The method of claim 1, further comprising forming a plurality of peripheral devices electrically connected to the plurality of memory strings.

* * * * *